(12) United States Patent
Tatsumi et al.

(10) Patent No.: US 7,325,300 B2
(45) Date of Patent: Feb. 5, 2008

(54) METHOD OF MANUFACTURING PRINTED WIRING BOARDS

(75) Inventors: Kiyohide Tatsumi, Nara (JP);
Toshihiro Nishii, Osaka (JP); Shinji Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 304 days.

(21) Appl. No.: 10/468,361

(22) PCT Filed: Oct. 11, 2002

(86) PCT No.: PCT/JP02/10592

§ 371 (c)(1),
(2), (4) Date: Aug. 19, 2003

(87) PCT Pub. No.: WO03/034798

PCT Pub. Date: Apr. 24, 2003

(65) Prior Publication Data

US 2004/0075988 A1    Apr. 22, 2004

(30) Foreign Application Priority Data

Oct. 12, 2001    (JP)    ............... 2001-314884

(51) Int. Cl.
*H01K 3/10* (2006.01)

(52) U.S. Cl. .................. 29/852; 29/846; 29/830; 156/288; 174/120 R; 174/110 E; 174/250

(58) Field of Classification Search .................. 29/830, 29/852, 846; 156/288; 174/250, 120 R, 174/110 E
See application file for complete search history.

(56) References Cited

U.S. PATENT DOCUMENTS

| | | | | |
|---|---|---|---|---|
| 3,344,515 A | * | 10/1967 | Schuster et al. | 29/852 |
| 3,557,983 A | * | 1/1971 | Hayes et al. | 228/115 |
| 3,969,177 A | * | 7/1976 | Doran et al. | 156/288 |
| 4,875,282 A | * | 10/1989 | Leibowitz | 29/830 |
| 4,875,283 A | * | 10/1989 | Johnston | 29/830 |
| 5,482,586 A | * | 1/1996 | Fujikake et al. | 156/233 |
| 6,967,705 B2 | * | 11/2005 | Farquhar et al. | 349/193 |

FOREIGN PATENT DOCUMENTS

| | | |
|---|---|---|
| JP | 8148814 | 6/1996 |
| JP | 09-29773 | 2/1997 |
| JP | 10-256726 | 9/1998 |
| JP | 10256726 | 9/1998 |
| JP | 10-303552 | 11/1998 |
| JP | 2000150704 | 5/2000 |
| JP | P2000-150704 A | 5/2000 |
| JP | 2000174437 | 6/2000 |
| JP | P2000-174437 A | 6/2000 |

* cited by examiner

*Primary Examiner*—Rick K Chang
(74) *Attorney, Agent, or Firm*—McDermott Will & Emery LLP

(57) ABSTRACT

In a heat and press stage of manufacturing printed wiring boards, a functional surface layer having release property is provided on a surface of a cushion, and a blocking layer is prepared between the functional surface layer and an inner layer having cushion property so that a frequency of use of the cushion can be increased.

24 Claims, 5 Drawing Sheets

METHOD OF MANUFACTURING PRINTED WIRING BOARDS

TECHNICAL FIELD

The present invention relates to a method of manufacturing printed wiring boards.

BACKGROUND ART

Electronic apparatuses have been downsized and become denser in packaging. This market trend involves printed wiring boards, to which electronic components are to be mounted, to be double-sided boards, or multi-layer boards. As such, higher density boards that can accommodate more circuits and more components are developed.

More elaborated design rules are available to a printed wiring board of higher density, which needs finer circuits than those of a conventional printed wiring board, so that a work technique for forming a finer circuit has been developed. For multi-layer boards, techniques of alignment of through-holes, via holes or circuits between layers have been developed in addition to a technique of connecting layers at finer pitches.

As an electric signal of a higher frequency is used, regulating a thickness of an insulating layer between active layers becomes a more vital factor in addition to the work accuracy of the circuits on the boards.

A conventional manufacturing method of printed wiring boards is described hereinafter. First, prepreg in stage B is sandwiched by two sheets of copper foil. The prepreg is formed by the following method: Woven fabric or non-woven fabric made of glass fiber or aramid fiber is impregnated with thermosetting resin and turned into a status called stage B. A layered structure sandwiched by metal plates at its top and bottom is hot-pressed by a hot-presser and integrally molded. After the hot-press, the copper foil is etched to form a desirable pattern, so that a printed wiring board is obtained.

FIG. 8 shows a sectional view illustrating a hot-presser used for the conventional manufacturing method of printed wiring boards. Board member 4 is formed of the foregoing prepreg sandwiched by two sheets of copper foil. The thickness of the prepreg is approx. 150 μm and the thickness of the copper foil is approx. 18 μm. Board member 4 is sandwiched by intermediate metal plates 3 made by polishing a stainless steel plate into a smooth and flat plate. The foregoing structure is referred to as the layered structure. Cushion 1 is placed on the top and bottom of the layered structure, and the layered structure is placed on carrying plate 6. As shown in FIG. 8, carrying plate 6 on which the layered structure and cushions 1 are placed is inserted between upper and lower hot-plates 7 of the hot-presser, then the layered structure is pressed by upper and lower pressing means 8.

Hot plate 7, which heats or cools board member 4, includes oil, vapor or cooling water, of which temperature is controlled as a heating medium or a cooling medium. The temperature and discharge quantity of the cooling medium are controlled, so that board member 4 is heated or cooled with a desirable temperature profile.

Pressing means 8 applies a pressure to board member 4, and a hydraulic cylinder is generally used as pressing means 8. In FIG. 8, a cylinder (not shown) is disposed at the lower side, and lower hot-plate 7 and carrying plate 6 are lifted upward by the cylinder and urged against pressing means 8 that functions as a fixed end of the upper side.

The heat and press stage includes a heating step of which peak temperature ranges 150-200□ and a pressing step of which pressure ranges 1.5-4 MPa, and this heat & press molds and hardens the prepreg in board member 4, so that the prepreg is integrated with the copper foil.

After the heat and press stage, board member 4 is taken out from the hot presser, and undergoes a boring step, a through-hole forming step where copper plating is provided in holes, and a patterning step where the copper foil is etched to form a desirable pattern before it becomes a printed wiring board.

Indirect materials such as intermediate metal plate 3, cushion 1, and carrying plate 6 are used repeatedly in the heat and press stage until they reach their own service lives. It is important for the heat and press stage to apply uniform pressure to board member 4. The printed wiring board compatible with the recent high-frequency performance is critical in particular about an accuracy of its thickness, therefore applying a uniform pressure is vital to manufacture quality printed wiring boards.

In order to obtain a uniform pressure, careful attention must be paid to parallelism of upper and lower pressing means 8 and hot plates 7 as well as dispersion of thickness of metal plate 3; however, the performance of cushion 1 is a critical factor among others. A conventional cushion employs rather thick paper such as craft paper, or elastic rubber sheet such as silicone rubber or fluoro-rubber.

A high-density printed wiring board, which has been recently demanded in the market, needs high accuracy in the manufacturing process, which thus encounters various difficulties. This situation is one of the problems to manufacture quality printed wiring boards at an inexpensive cost. The foregoing heat and press stage is strongly required to carry out the steps accurately at a high reproducibility. Respective service lives of the indirect materials such as intermediate metal plate 3, cushion 1 and carrying plate 6 directly influence the manufacturing cost, so that those service lives are also strongly required to be extended.

In the conventional manufacturing method of the printed wiring boards, paper cushion must be replaced every heat & press action because of its poor durability, and the paper cushion cannot bear a plurality of the heat & press actions. In the case of using a rubber-sheet cushion, it must be replaced before it loses the uniform pressure, namely, several tens of heat & press actions. A use of the rubber-sheet cushion in plural times results in adhering of the rubber-sheet to hot-plates 7, intermediate metal plates 3, or carrying plate 6. When the layered structure is taken out, it is thus sometimes difficult to remove cushion 1 from the layered structure.

In the case of manufacturing high-temperature resistant boards that are in progress of development, a high-temperature press at not lower than 200° C. is needed as a condition of the heat and press stage. In the case of using conductive paste or the like as interfacial connecting means for the printed wiring boards, a higher pressure than the conventional manufacturing method must be applied to the conductive paste for effecting electric connection. This will be detailed in the exemplary embodiments described later. As such, the durability of the cushion is raised as a problem, and so much severe manufacturing condition is required.

On top of that, a high-density printed wiring board, to be used in portable electronic devices recently prevailing in the market, needs to be controlled its circuit impedance at a desirable value as well as its allowable thickness within a narrower dispersion.

A problem of the cushion such as cushion property or irregular thickness will cause a wider dispersion in the thickness of the printed wiring boards, and makes the boards inadequate quality-wise.

DISCLOSURE OF THE INVENTION

The present invention addresses the problems discussed above and aims to provide a method of manufacturing quality printed-wiring boards with cushion property being kept for a long period. To achieve this goal, the manufacturing method of the present invention employs a sheet-like layered body formed of a plurality of layers as a cushion to be used in a heat and press stage. A functional surface layer is provided to the surface of the cushion, and a blocking layer is prepared between the functional surface layer and an inner layer having cushion property.

PREFERRED EMBODIMENTS OF THE INVENTION

Figure 1:
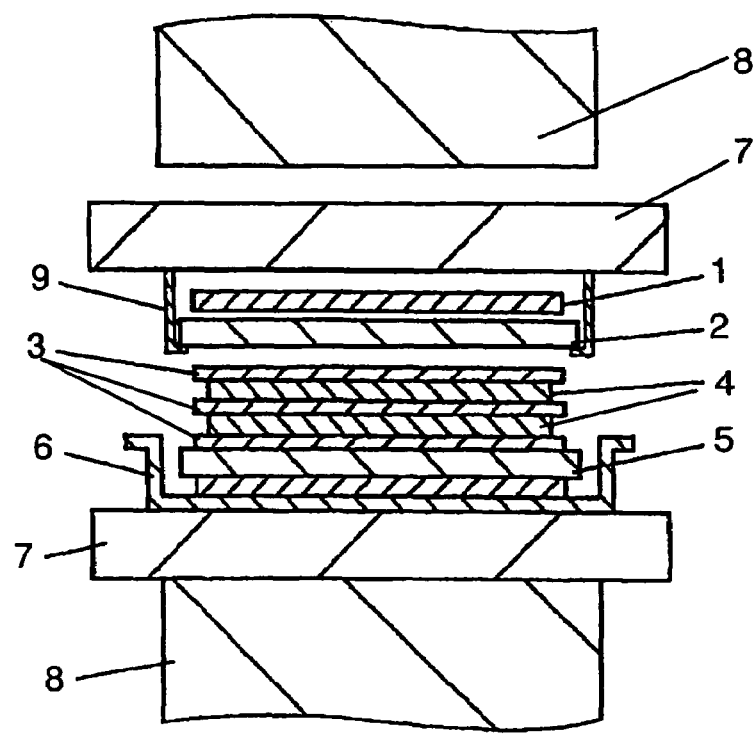
FIG. 1 shows a sectional view of a hot-presser used in a manufacturing method of a printed wiring board in accordance with a first exemplary embodiment of the present invention.

The manufacturing method of printed wiring boards of the present invention relates to heat & press applied to a layered structure which is formed by sandwiching a board member made of a singular material or plural materials with plural metal plates. A feature of the method is to use a cushion formed of a sheet-like layered body including a plurality of layers during the application of heat and press. Properties required to the cushion such as cushion property, durability, release property with a hot plate are realized by respective layers of the sheet-like layered body. This structure allows increasing a frequency of use of the cushion.

The sheet-like layered body used in the present invention comprises the following elements:
an inner layer formed of an elastic layer or a compound layer of the elastic layer and an reinforcing layer; and
a functional surface layer formed on both the faces or a single face of the inner layer.

The inner layer having durability and the functional surface layer having release property work appropriately, so that the frequency of use of the cushion can be increased with respect to conventional cushions.

The elastic layer is made mainly of heat resisting rubber such as fluoro-rubber or silicone rubber, so that the durability of the elastic layer can be maintained during the heat and press stage that needs a high temperature.

The reinforcing layer is made of woven fabric or non-woven fabric formed mainly of heat resisting fiber such as aramid fiber. Flexibility and follow-up property of the woven or non-woven fabric can increase both of strength and durability of the inner layer. The reinforcing layer made of heat resisting film uniforms the physical properties thereof, and reduces a thickness thereof.

The functional surface layer of the present invention is made of woven or non-woven fabric formed mainly of heat resisting fiber and used in the manufacturing method of printed wiring boards, the method will be defined in claim 2. A use of woven or non-woven fabric improves the release property of the cushion, and increases the durability against friction. A thickness of the woven or non-woven fabric falling within the range of 0.05 mm-0.5 mm allows the functional surface layer to be compatible with durability and heat conductivity. A use of fabric of which yarn count falls within the range of 10-90 allows the thickness of the functional surface layer to be optimized for being compatible between the durability and the heat conductivity.

The heat resisting film can form the functional surface layer at a rather inexpensive cost.

Forming the blocking layer on a border face between the functional surface layer and the inner layer prevents the material of the inner layer from passing through the functional surface layer and coming up on a surface of the cushion. This structure can advantageously avoid damaging the release property. A blocking layer made of thermosetting resin can form a durable blocking layer with ease. A thickness of the blocking layer not more than 100 µm can maintain the cushion property. On top of that, an appropriate control of the flexibility of the blocking layer can prevent delaminations of the interfaces between the functional surface layer, blocking layer and inner layer.

Heat treatment of the cushion at 270° C. or over in the manufacturing process increases the durability of the cushion, so that a frequency of use of the cushion can be increased.

A board member to be heated and pressed includes sheeted material, which is sandwiched by metal sheets at both faces, or the metal sheet is placed on a single face. This structure allows the metal sheet to be integrated with the surface of the board member with ease. A board member to be used as a double sided board or a multi-layer board is equipped with the sheeted material and the metal sheet on its single face or both the faces. This structure allows forming a multi-layered board member with ease.

In the case of using the board member made of the prepreg formed by impregnating thermosetting resin into a reinforcing material such as non-woven fabric or woven fabric before the fabric is turned into stage B, the board member can be sheeted material excellent in conservation and workability. At the same time, the board member results in a printed wiring board excellent in thickness accuracy and strength. A use of glass fiber in the non-woven or woven fabric as the reinforcing material of the board member reduces the cost of the reinforcing material and results in a printed wiring board excellent in stableness of the dimensions. A use of aramid fiber in the non-woven or woven fabric as the reinforcing material results in a printed wiring board of lightweight and excellent in strength.

A board member including interfacial connecting means in the entire or parts of the sheeted material is integrally molded, and at the same time, effects interfacial connection through the heat and press stage. If interfacial-connecting means undergoes the pressure at the heat and press stage and effects the interfacial connection, then the uniform pressing at the heat and press stage can produce a quality electrical-connection. In the case of using conductive paste filled in through holes or non-though holes as interfacial connecting means, the paste is compressed steadily at the heat and press stage, so that a quality electrical-connection between layers can be expected. In the case of using conductive bumps as interfacial connecting means disposed in through holes or non-though holes, the heat and press stage applies a high pressure uniformly to the board member so that the conductive bumps can be strongly fit to the circuit or the metal sheet.

The manufacturing method of the printed wiring board compresses the board member thickness-wise by in the range of not less than 1% and not more than 20%. Since the heat and press stage applies uniform pressure to the board member, a steady compression of the board member and a stable thickness of the printed wiring board can be realized with a rather low pressure and in excellent reproducibility.

Setting of the max. temperature of the board member undergoing the heat and press stage at in the range of 190° C.-250° C. can realize the heat and press working at a high temperature necessary for manufacturing the printed wiring board which employs heat-resisting material, and yet, a frequency of use of the cushion is not decreased.

Setting of the max. pressure of the board member undergoing the heat and press stage at in the range of 4 MPa-20 MPa can be effective to the board member having interfacial connecting means that produces electrical connection between layers with pressure.

In the case of dealing with a plurality of board members all together in the manufacturing method of the present invention, the cushion is split into some pieces of the same numbers as that of pieces of the split board member or the split sheeted material contained in the board member such that a size of respective split cushions is greater than a size of the respective split board members or the split sheeted material. This preparation allows applying a proper and uniform pressure to each one of the split board members.

Providing a space between respective pieces of the split cushions allows the cushions to be uniformly deformed when the pressure is applied, so that the board member is compressed uniformly.

Between the upper and lower heating means, the following elements are layered from the bottom to the top in this order: lower cushion, lower metal plate, intermediate metal plate, board member, intermediate metal plate, upper metal plate and upper cushion. In other words, the thickness of the lower and upper metal plates is respectively greater than that of the intermediate metal plate, so that the board member can be uniformly pressed due to the rigidity of the lower and upper metal plates.

The present invention prepares a plurality of units formed of the intermediate metal plates and the board member depending on the number of the board members such as the intermediate metal plate, board member, intermediate metal plate, board member, intermediate metal plate, in this order. One action of the heat & presser can deal with a plurality of board members, and yet, apply a uniform pressure to respective board members.

Upper heating means holds both of or one of an upper cushion and an upper metal plate, so that the layered structure can be taken out and disassembled with ease after the heat and press stage. Further, maintenance of the upper cushion and the upper metal plate can be simply done.

Exemplary embodiments of the present invention are demonstrated hereinafter with reference to FIG. 1-FIG. 7.

Exemplary Embodiment 1

FIG. 1 shows a sectional view of a hot-presser used in a manufacturing method of a printed wiring board in accordance with the first exemplary embodiment of the present invention. Similar elements to those in the conventional one have the same reference numbers.

As shown in FIG. 1, two board members 4 sandwiched by three intermediate metal plates 3 are placed on lower metal plate 5, which is then placed on carrying plate 6 via cushion 1 in between.

Board member 4 includes two sheets of prepreg made of woven fabric of glass fiber, and a thickness of the woven fabric is approx. 130 μm. The two sheets of prepreg are sandwiched by two sheets of copper foil to form board member 4. Intermediate metal plates 3 are made from stainless steel having a thickness of approx. 1 mm and lower metal plate 5 is made from stainless steel having a thickness of approx. 2 mm. Carrying plate 6 is made from steel plate of approx. 5 mm thickness. The steel plate is bent to form a recess as shown in FIG. 1. A pair of hot-plates 7 are disposed above and under the layered structure, and a pair of pressuring means 8 are also disposed above and under the layered structure. Upper hot-plate 7 holds cushion 1 and upper metal plate 2 with holder 9.

Figure 2:
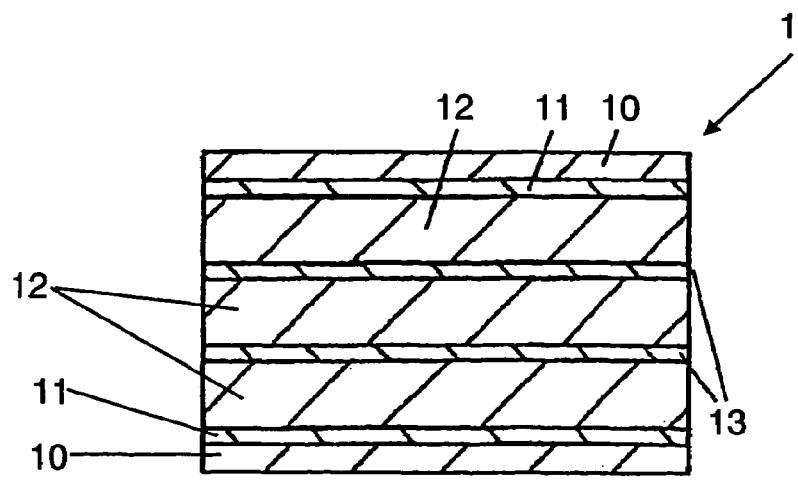
FIG. 2 shows a sectional view of a cushion used in the manufacturing method of a printed wiring board in accordance with the first exemplary embodiment of the present invention.

FIG. 2 shows a sectional view of cushion 1 used in the first exemplary embodiment. Cushion 1 is formed of an inner layer and a functional surface layer. The inner layer has a layered structure including two layers of reinforcing members 13 and three layers of fluoro-rubber 12. Any known fluoro-rubber can be used as this fluoro-rubber, and any curing agent, filler and other compound agents can be added depending on necessity. It is preferable to use fluoro-rubber of polyol-cured binary copolymer, because of its excellence in permanent deformation due to compression. Reinforcing member 13 can use heat-resisting film, fiber or other materials. In this embodiment, woven or non-woven fabric made of fiber is used. Any known fabric made from heat resisting fiber can be used as reinforcing material 13. It is preferable to use woven or non-woven fabric made from such a heat-resisting fiber as aramid fiber, aromatic polyester fiber, carbon fiber, phenol resin fiber, fluoro-resin fiber, PBO fiber, glass fiber, alumina fiber or metal fiber.

Next, surface woven fabric 10 is used as the functional surface layer of cushion 1. One of the foregoing heat-resisting fibers can be used to be the surface fabric. The thickness of the surface woven fabric 10 is preferably not more than 0.5 mm because fabric 10, as a functional surface layer, should not block heat conduction from the hot plate. The lower limit of the thickness is 0.05 mm. If fabric 10 is thinner than this lower limit, the fibers can be cut due to inadequate strength by repeating the press work, therefore, the thickness ranges more preferably from 0.1-0.2 mm.

The fiber to be used in the functional surface layer of the present invention is preferably within the range of yarn count 10-90. Using the fiber of less than 10 yarn count makes the surface fabric too thick. On the contrary, using the fiber of greater than 90 yarn count makes the surface fabric weak, so that the fibers can be cut due to inadequate strength by repeating the press work. Therefore, it is more preferable to use the fiber ranging from 60 to 80 yarn counts. Woven fabric of any known weaves such as plain weave, twill weave, multi-weave, and satin weave can be used as the surface fabric.

Other than the foregoing woven fabrics, such as non-woven fabric made from heat-resisting fiber, or heat resisting film can be used as the functional surface layer depending on its applications. However, it is most preferable to use heat-resisting woven fabric that is excellent in the release property, cushion property and flexibility.

A structure of the cushion is described hereinafter. Woven fabric 10, working as the functional surface layer bordering on the inner layer made of fluoro-rubber 12, can be directly integrated with the inner layer by curing non-cured rubber together with woven fabric 10 laid on the inner layer. However, in this first embodiment, blocking layer 11 is prepared between the inner layer and the functional surface layer. If woven fabric 10 as the functional surface layer is directly integrated with fluoro-rubber 12, the rubber intrudes in the net of the fiber in plural heat & press actions, so that the release property of the surface is damaged. Even if no problem is found in the manufacturing process, since the temperature rises over 180 in the heat and press stage, the fluoro-rubber is softened during the press and sometimes squeezes out from the net of fiber to the surface of the cushion. This problem occurs more conspicuously in the case of using a thinner surface fabric layer. The fluoro-rubber squeezing out from the surface fabric adheres to the hot plate or the intermediate metal plate, so that the release property of the cushion is lowered. The present invention prepares blocking layer 11 between the surface fabric and the fluoro-rubber in order to prevent the fluoro-rubber from squeezing out from the net of the fabric. Even if the rubber squeezed out, the blocking layer would minimize the squeezing amount, so that the release property is not affected. The rubber thus does not contact with the hot plate or the intermediate metal plate, and as a result, the release property of the woven fabric can be maintained for a long period.

As a material of blocking layer 11, metal, thin film or a plate of organic material, can be used as long as they are heat resistive and capable of blocking the net of the surface fabric. A use of thermosetting resin among others results in a preferable effect. To be more specific, thermosetting resin such as phenol resin, epoxy resin, melamine resin, urea resin, alkyd resin, acrylic resin, unsaturated polyester resin, diallyl phthalate resin, polyimide resin, and silicone resin is usable.

A thickness of blocking layer 11 should not damage the cushion property, and it should be not more than 100 μm, preferably within the range of 2-20 μm.

The cushion in accordance with the first embodiment is heated at not lower than 260° C. after the surface fabric is prepared. The secondary curing is provided to fluoro-rubber normally at lower than 260° C. However the heat treatment at a high temperature previously discussed discharges decomposed products and unreacted substances such as moisture and chemical substances, so that the reaction progresses sufficiently. Thus the rubber stays stable and can bear more numbers of press actions.

Figure 3:
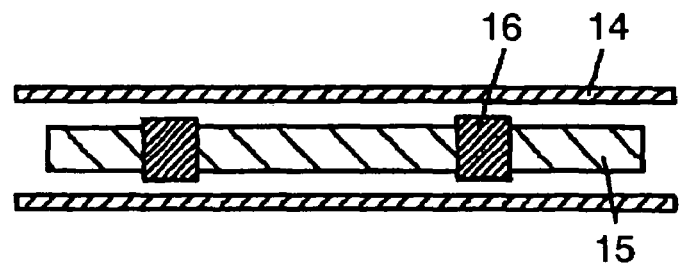
FIG. 3 shows a sectional view of a board member used in the manufacturing method of a printed wiring board in accordance with the first exemplary embodiment of the present invention.

FIG. 3 shows a sectional view illustrating a structure of board member 4. Prepreg 15 is formed by impregnating epoxy resin varnish into woven fabric made of glass fiber, and the fabric undergoes a drying stage to be in stage B. Prepreg 15 thus produced has a thickness of approx. 130 μm. Then two sheets of copper foil 14 having a thickness of approx. 18 μm sandwich prepreg 15. Through-holes of approx. 200 μm across are formed on Prepreg 15 by drilling or laser beam machining, and are filled up with copper paste 16 made of mainly copper powder and thermosetting resin.

Figure 4:
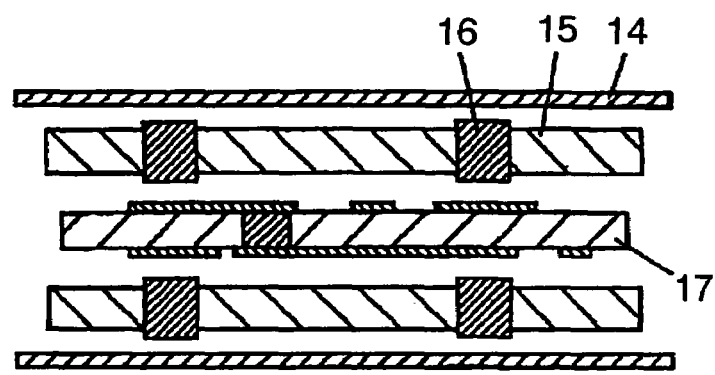
FIG. 4 shows a sectional view of a board member used in the manufacturing method of a printed wiring board in accordance with the first exemplary embodiment of the present invention.

Instead of the foregoing structure, FIG. 4 provides another structure, i.e., inner board 17 is used as a core board. This structure can be also used for board member 4.

Figure 5:
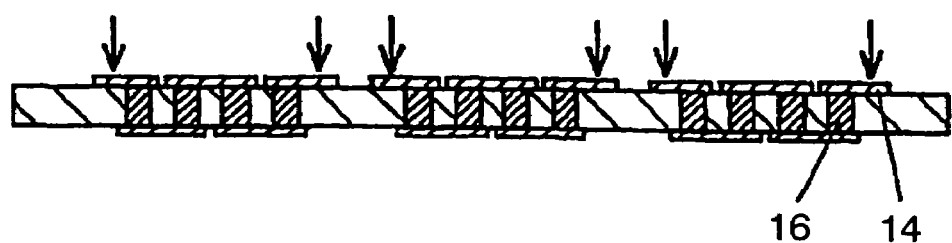
FIG. 5 shows a sectional view of a printed wiring board used in the manufacturing method of a printed wiring board in accordance with the first exemplary embodiment of the present invention.

A printed wiring board manufactured through the heat and press stage discussed above is described hereinafter. After the heat and press stage, copper foil 14 on the surface of the board member is etched to obtain a desirable pattern, and the double sided printed-wiring board as shown in FIG. 5 is obtained. Prepreg 15 is formed of non-woven fabric made of aramid fabric, and heat-resisting epoxy resin. The heat and press stage holds the board member for one hour at 200° C. and 5 MPa so that both the surfaces can be conductive to the copper paste.

FIG. 5 shows a sectional view illustrating a chain pattern that connecting three sets of copper patterns each of which surface and rear face are connected with copper paste 16. An electric resistance between the resistance-measurable lands marked with arrow marks is measured as a resistance of each circuit block. In FIG. 5, four interfacial connecting sections per block of each copper foil pattern are prepared for purpose of explanation. In an actual printed wiring board, one block contains 500 series connections, and one board contains 50 circuit blocks.

A number of heat & press actions are carried out using various kinds of cushions 1, and the foregoing printed wiring boards are manufactured. Then respective electric resistance values of total 100 blocks contained in two both-sided printed wiring boards are measured. Values of averages, the max. and the min. of the resistance measured are plotted, and the average values are connected with straight lines, as FIG. 6 shows.

First, craft paper is used as the cushion, then the resistance value of the circuit block becomes unstable at the second heat & press action and onward. This case is thus not drawn in FIG. 6.

Figure 6:
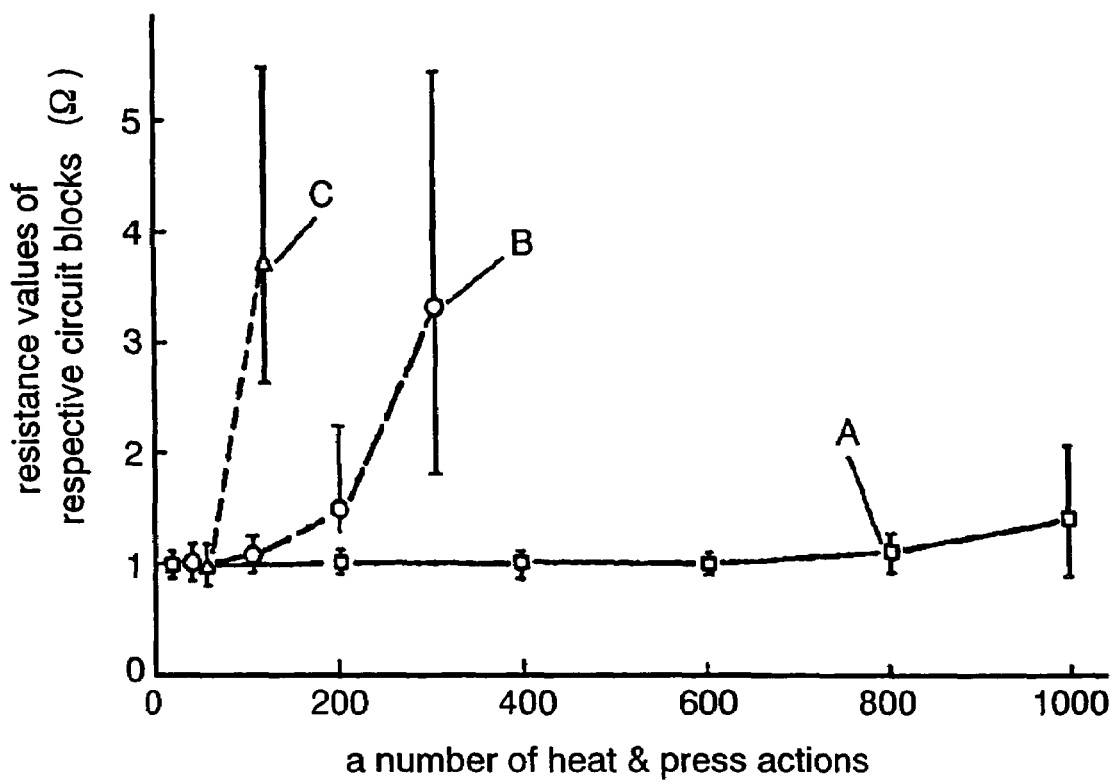
FIG. 6 shows a graph illustrating a relation between the number of heat & press actions and resistance values of respective circuit-blocks of the printed wiring board produced through the manufacturing method in accordance with the first exemplary embodiment of the present invention.

Cushion 1 formed of the structure shown in FIG. 2 minus blocking layer 11 is used in this experiment, and the result is shown with graph C in FIG. 6. Since blocking layer 11 has been removed, after around 10 actions of heat & press, fluoro-rubber 12 squeezes out to gaps of surface fabric of cushion 1. Thus press in the heat and press stage applied to a face does not produce uniform pressure to the entire face, so that respective resistance values of the circuit blocks disperse. After 100 actions of heat & press, the resistance values vary so large that cushion 1 cannot be used any longer. On top of that, cushion 1 adheres to upper and lower metal plates 2, 5 due to the squeezing-out fluoro-rubber 12, so that disassembling of the layered structure after the heat and press stage becomes difficult.

Next, cushion 1 of the structure shown in FIG. 2 is used in this experiment. The result is shown with graph B in FIG. 6. In this case, cushion 1 can bear approx. 100 actions of heat & press without any problems, so that the advantage of increasing a frequency of use is recognized. However, after 200 actions of heat & press, fluoro-rubber 12 reaches the limit of durability, and the press applied does not produce uniform pressure to the entire surface, so that the resistance values disperse.

Next experiment is to heat cushion 1 of the structure shown in FIG. 2 at 270° C. for two hours before cushion 1 is used in the heat and press stage. The result is shown with graph A in FIG. 6, and the result tells that cushion 1 can bear approx. 800 heat & press actions.

As discussed above, according to the advantages of this first exemplary embodiment, a frequency of use of the cushion can be extended even in the heat and press stage that requires a rather severe condition. At the same time, the resistance values of the interfacial connecting sections become advantageously stable. As FIG. 6 shows, the resistance value of interfacial connection formed of conductive paste is stable, therefore, the inventor expects a uniform compression of the board member. Actually, a printed wiring board manufactured is measured to find an in-plane dispersion of as narrow as approx. 5 μm with respect to the layer thickness of approx. 150 μm including the copper foil prepared on the surface and the rear face. This measurement tells that satisfactory uniformity is obtainable.

A reinforcing material to be used in the inner layer of the cushion can employ a mixed material of woven and non-woven fabrics, such as non-woven fabric, made of glass fiber, sandwiched by two sheets of glass fibers.

The thermosetting resin to be used in the present invention can be one of the following resins: epoxy resin, epoxy-melamine resin, unsaturated polyester resin, phenol resin, polyimide resin, cyanate resin, ester-cyanate resin, naphtalene resin, urea resin, amino resin, alkyd resin, silicon resin, furan resin, polyurethane resin, amino-alkyd resin, acrylic resin, fluoro-resin, polyphenyline-ether resin, cyanate-ester resin. Besides the foregoing individual resins, a thermosetting resin composition formed of plural resins discussed above, or a thermosetting resin composition modified by thermoplastic resin can be used. Fire retardant or inorganic filler can be added depending on necessity.

Instead of the copper foil, a circuit made from a metal sheet tentatively fixed to a supporter can be used.

Conductive paste is used as interfacial connecting means, and the conductive paste, to be more specific, can be the following various compositions: conductive particles such as copper powder mixed with thermosetting resin including curing agent, conductive particles mixed with polymeric material having an appropriate viscosity such that the polymeric material is discharged into the board member during the heat and press stage, or conductive particles mixed with solvent, and the like.

Other than the conductive paste, a columnar conductive protrusion formed by metal plating can be used as the interfacial connecting means, or conductive particles not in pasted state and having a rather large diameter can be independently used as the interfacial connecting means.

Exemplary Embodiment 2

Figure 7:
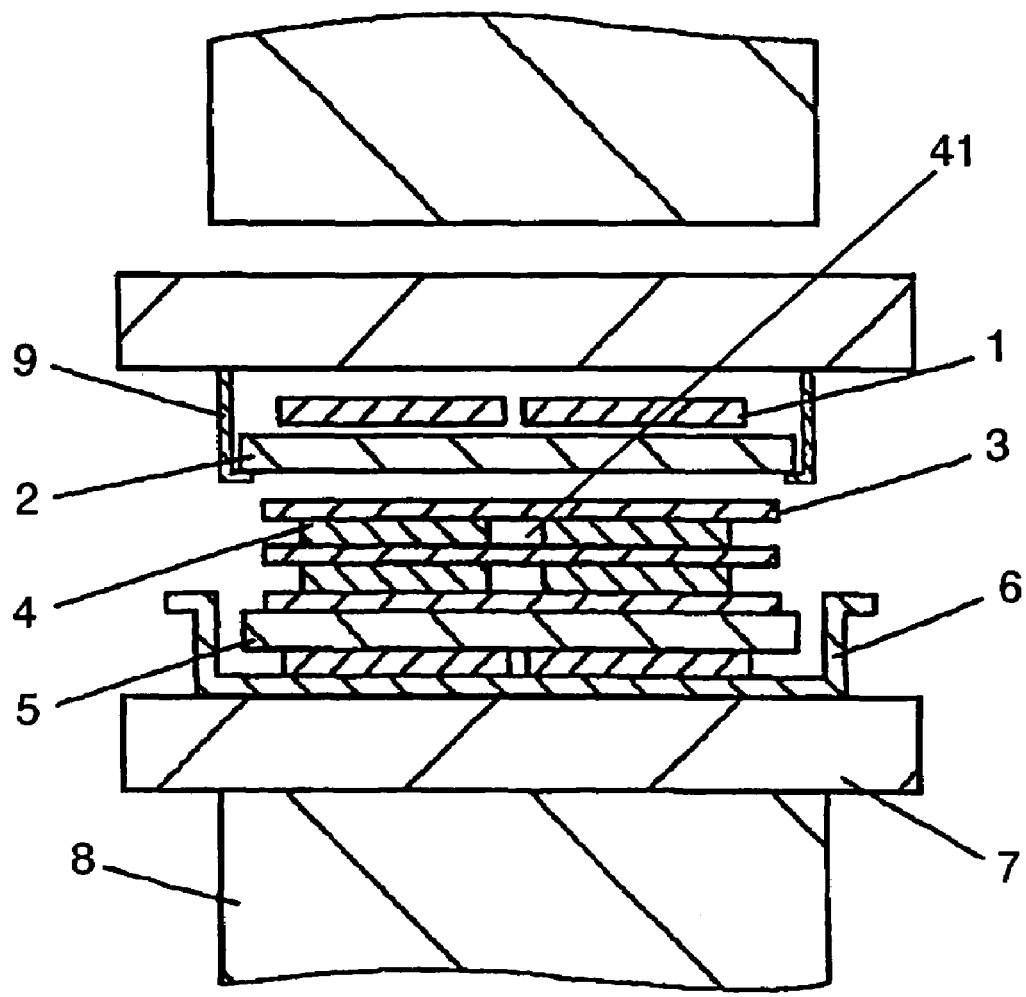
FIG. 7 shows a sectional view of a hot-presser used in a manufacturing method of a printed wiring board in accordance with a second exemplary embodiment of the present invention.
Figure 8:
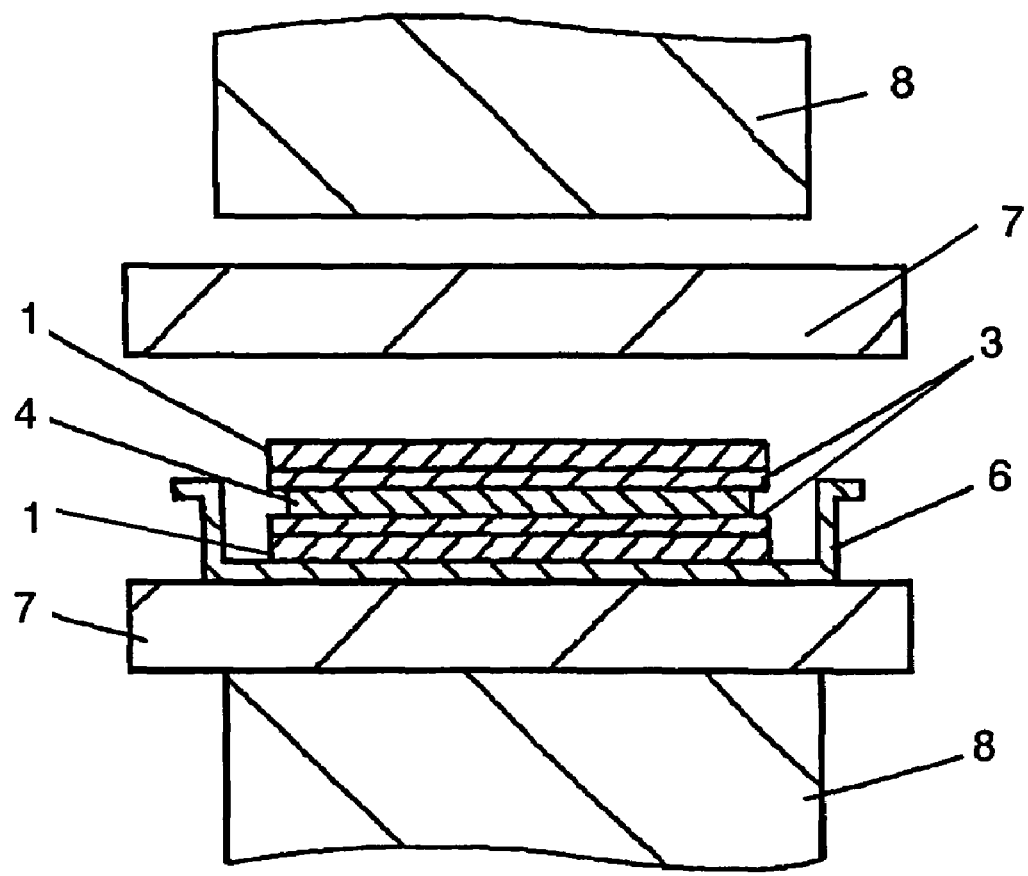
FIG. 8 shows a sectional view of a conventional hot-presser.

FIG. 7 shows a sectional view of a hot-presser indicating a manufacturing method of printed wiring boards in accordance with the second exemplary embodiment of the present invention.

FIG. 7 differs from FIG. 1 in the following point: board members 4 sandwiched by intermediate metal plates 3, and two board members are prepared in each layer. In this case, plural layered structures disposed on one plane are to undergo the heat and press stage. In this case, some problems are expected as follows: When a sheet of cushion 1 covering an entire face to be pressed is used, cushion 1 having a section corresponding to gap 41 between two board members 4 on the plane is not pressed, so that cushion 1 is deformed convexly due to pressure from the surroundings. The pressure applied to board member 4 sometimes becomes non-uniform due to this convex of cushion 1. This problem should be overcome when the uniformity of thickness of board member 4 after the heat and press stage is a critical point, or when the interfacial connecting means is effected to be electrically conductive by the press at the heat and press stage.

The inventors carried out various experiments about how to uniform the pressure to be applied to the board member, and found the result below: As shown in FIG. 7, cushion 1 is split into some pieces of the same number as board member 4 is split, and placed generally at the same place as individual board members 4 split into some pieces. The inventors found that this structure was effective to uniform the pressure. The inventors also found the following tips about this subject from the experiments: An accuracy of piling up the layered structure is taken into consideration, and individual cushions 1 having a little bit larger size than individual board members 4 are to be used. Cushion 1 is also compressed as board member 4 is by pressure and heating during the heat and press stage, and the size of cushion 1 thus expands, therefore, two sheets of cushion 1 should be placed with space in order not to interfere with each other in the heat and press stage.

An advantage of this second embodiment is that indirect materials other than the hot-presser or the cushion are not required to change their sizes when board member 4 is obliged to reduce its size due to maintaining an accuracy of interfacial matching or other reasons. The uniform pressure is still obtainable without changing the sizes of the indirect materials.

INDUSTRIAL APPLICABILITY

A cushion formed by layering a plurality of sheet-like laminated bodies is used in the manufacturing method of printed wiring boards. This cushion can be used in more numbers of working actions than conventional cushions, so that the manufacturing cost can be reduced, and quality printed wiring boards can be manufactured from the standpoint of uniformity of the board thickness.

Further, a size of the cushion can be changed by split or other methods corresponding to the size of the board member, so that uniform pressure applied to the board member in various sizes is obtainable. The uniformed pressure applied to the board member during a heat and press stage produces a conspicuous advantage particularly when conductive paste used as interfacial connecting means effects an electrical connection by compression, or when a thickness accuracy of printed wiring boards is required. Increasing a frequency of use of the cushion can advantageously reduce the manufacturing cost of the printed wiring boards.

As a result, interfacial electric-connection using interfacial connecting means such as conductive paste becomes more stable, and the more uniform board thickness is obtainable. The present invention can thus provide printed wiring boards of high quality and high density.

The invention claimed is:

1. A method of manufacturing printed wiring boards, the method including the step of applying heat and press (heat and press stage) to both a layered structure, which comprises a board member and a metal plate, and a cushion which is disposed between at least one hot-plate of a hot-presser applying heat and press and the layered structure, wherein
the cushion is a reusable sheet-like layered body which includes an inner layer, a blocking layer, and a functional surface layer,
the functional surface layer is formed on at least one of the faces of said sheet-like layered body, and
the blocking layer exists on an interface between the functional surface layer and the inner layer,
wherein the blocking layer is thermosetting resin.

2. The method of manufacturing printed wiring boards of claim 1, wherein the inner layer includes one of a single elastic layer and a compound layer formed of the elastic layer and a reinforcing layer.

3. The method of manufacturing printed wiring boards of claim 2, wherein the elastic layer is formed mainly of heat-resisting rubber.

4. The method of manufacturing printed wiring boards of claim 3, wherein the heat-resisting rubber is one of fluoro-rubber and silicone-rubber.

5. The method of manufacturing printed wiring boards of claim 2, wherein the inner layer includes the compound layer formed of the elastic layer and the reinforcing layer, and
wherein the reinforcing layer is one of woven fabric and non-woven fabric, both fabrics being made mainly of heat-resisting fiber.

6. The method of manufacturing printed wiring boards of claim 5, wherein the heat-resisting fiber is aramid fiber.

7. The method of manufacturing printed wiring boards of claim 2, wherein the reinforcing layer is heat-resisting film.

8. The method of manufacturing printed wiring boards of claim 2, wherein the functional surface layer is one of woven fabric and non-woven fabric, both the fabric being made mainly of heat-resisting fiber.

9. The method of manufacturing printed wiring boards of claim 8, wherein one of the woven fabric and the non-woven fabric has a thickness ranging from not less than 0.05 mm to not more than 0.5 mm.

10. The method of manufacturing printed wiring boards of claim 8, wherein a thickness of the fiber ranges from not less than 10 yarn count to not more than 90 yarn count.

11. The method of manufacturing printed wiring boards of claim 1, wherein the functional surface layer is heat-resisting film.

12. The method of manufacturing printed wiring boards of claim 1, wherein the blocking layer has a thickness of not more than 100 μm.

13. The method of manufacturing printed wiring boards of claim 1, wherein the cushion undergoes a heat treatment at not lower than 270° C.

14. The method of manufacturing printed wiring boards of claim 1, wherein the board member comprises a sheeted material and a metal foil disposed on at least one of faces of the sheeted material, wherein the sheeted material is a prepreg in stage B, the prepreg being formed by impregnating thermosetting resin into one of woven fabric and non-woven fabric, both the fabrics working as reinforcing material.

15. The method of manufacturing printed wiring boards of claim 14, wherein the reinforcing material is one of glass fiber and aramid fiber.

16. The method of manufacturing printed wiring boards of claim 1, wherein the board member comprises a printed wiring board manufactured in advance, a sheeted material disposed on at least one of faces of the printed wiring board and a metal foil, wherein the sheeted material is a prepreg in stage B, the prepreg being formed by impregnating thermosetting resin into one of woven fabric and non-woven fabric, both the fabrics working as reinforcing material.

17. The method of manufacturing printed wiring boards of claim 16, wherein the reinforcing material is one of glass fiber and aramid fiber.

18. The method of manufacturing printed wiring boards of claim 1, wherein the board member includes interfacial connecting means.

19. The method of manufacturing printed wiring boards of claim 18, wherein the interfacial connecting means is made of such material as effecting a connection between layers after being compressed at the heat and press stage.

20. The method of manufacturing printed wiring boards of claim 18, wherein the interfacial connecting means is made of conductive paste, which is filled in one of a through hole and a non-through hole formed on the board member.

21. The method of manufacturing printed wiring boards of claim 18, wherein the interfacial connecting means is made of a conductive bump, which is disposed in one of a through hole and a non-through hole formed on the board member.

22. The method of manufacturing printed wiring boards of claim 1, wherein the heat and press stage compresses the board member in a thickness direction by not more than 20% and not less than 1%.

23. The method of manufacturing printed wiring boards of claim 1, wherein the heat and press stage heats the board member to a maximum temperature ranging from not less than 190° C. to not more than 250° C.

24. The method of manufacturing printed wiring boards of claim 1, wherein the heat and press stage applies a pressure to the board member at a maximum pressure ranging from not less than 4 MPa to not more than 20 MPa.

* * * * *